United States Patent [19]

Ito et al.

[11] 4,309,666

[45] Jan. 5, 1982

[54] SEMICONDUCTOR AMPLIFIER

[75] Inventors: Toshimasa Ito; Jiro Aiba, both of Funabashi, Japan

[73] Assignee: TDK Electronics Co., Ltd., Tokyo, Japan

[21] Appl. No.: 934,498

[22] Filed: Aug. 17, 1978

Related U.S. Application Data

[63] Continuation-in-part of Ser. No. 907,908, May 22, 1978, abandoned, which is a continuation-in-part of Ser. No. 716,636, Aug. 23, 1976, abandoned.

[30] Foreign Application Priority Data

Aug. 26, 1975 [JP] Japan ................................ 50-103137

[51] Int. Cl.[3] ............................ H03F 3/19; H03F 3/60

[52] U.S. Cl. ........................................ 330/286; 333/1.1

[58] Field of Search .................... 330/53, 56, 286, 287, 330/295; 333/1.1

[56] References Cited

U.S. PATENT DOCUMENTS

| | | | |
|---|---|---|---|
| 2,848,714 | 8/1958 | Ring | 333/1.1 UX |
| 2,877,427 | 3/1959 | Butler | 333/128 |
| 3,986,147 | 10/1976 | Carter et al. | 333/1.1 |

*Primary Examiner*—Paul L. Gensler

*Attorney, Agent, or Firm*—Armstrong, Nikaido, Marmelstein & Kubovcik

[57] ABSTRACT

The present amplifier has a pair of semiconductor amplifiers, and the input signal is divided to said amplifiers, the outputs of which are combined together by the power combiner. At least one of the power divider and the power combiner has a plurality of circulators which have three terminals. The characteristic impedance of one terminal is $2Z_O$ and that of another terminals is $Z_O$. Thus, by connecting the terminals of the characteristic impedance $2Z_O$ of two circulators, the resultant characteristic impedance $Z_O$ is obtained and can be connected to an external circuit directly.

The present amplifier can be utilized in particular in VHF or higher frequency band.

2 Claims, 7 Drawing Figures

SEMICONDUCTOR AMPLIFIER

COPENDING APPLICATION

The present application is the Continuation-In-Part application of the U.S. patent application Ser. No. 907,908, filed May 22, 1978, now abandoned, which is a Continuation-In-Part of Ser. No. 716,636, Aug. 23, 1976, now abandoned.

BACKGROUND OF THE INVENTION

The present invention relates to the improvement of an amplifier, in particular, relates to a semiconductor amplifier which is used in VHF or higher frequency band.

FIG. 1 shows a blockdiagram of a prior semiconductor amplifier which can be used for a television transmitter in VHF or higher frequency band. In FIG. 1, a pair of semiconductor amplifiers 30 and 32 are connected in parallel since a single semiconductor amplifier can not provide enough output power. In order to assure the parallel operation of two semiconductor amplifiers, a power divider 10 and a power combiner 20 are utilized as shown in the figure. The input terminal(IN) which has the characteristic impedance $Z_0$ is applied to the power divider 10, which provides in turn a pair of outputs. Each of the outputs of the power divider 10 has the characteristic impedance $Z_0$ and is connected to the amplifier 30 or 32. Also, each output of the amplifier 30 or 32 is connected to the input of the power combiner 20, the output of which is connected to the output terminal(OUT). Of course, the characteristic impedance of the input terminals and output terminal of the power combiner 20 is $Z_0$. Each of the power divider and the power combiner comprises a hybrid circuit 12 and a pair of circulators 14 and 16. The hybrid circuit 12 has an input terminal and a pair of output terminals, or an output terminal and a pair of input terminals, and all the terminals have the same characteristic impedance $Z_0$. FIG. 2 is the example of the hybrid circuit, and is called the Wilkinson type hybrid circuit. The Wilkinson type circuit has legs $P_1$ and $P_2$, the length of which is $\lambda/4$, and these legs are connected to another leg $P_3$. The terminals a, b, and c of the Wilkinson circuit are connected to an outside element as shown in FIG. 1. The resistance R is connected between the terminals b and c, for providing the in-phase signals between those terminals.

The circulators 14 and 16 in FIG. 1 function to provide a stable operation of the amplifiers 30 and 32. In particular, when there is something wrong with the outside circuit connected to the output terminal(OUT) of the present amplifier, the output power from the two semiconductor amplifiers will be reflected due to the mismatching of the characteristic impedance, and the reflected power is absorbed in the circulators 14 and/or 16.

Since all the terminals of the hybrid circuit 12 have the same characteristic impedance $Z_0$, all the terminals of the circulators have the same characteristic impedance $Z_0$, accordingly.

However, the amplifier shown in FIG. 1 has the disadvantage that the structure is complicated, in particular, the presence of the hybrid circuits makes the structure more complicated.

SUMMARY OF THE INVENTION

It is an object, therefore, of the present invention to overcome the disadvantage of a prior semiconductor amplifier by providing a new and improved semiconductor amplifier.

It is also an object of the present invention to provide a semiconductor amplifier the structure of which is simplified.

The above and other objects are attained by a semiconductor amplifier having a plurality of semiconductor amplifiers, each input of which is connected to the input terminal through a power divider, and each output of said semiconductor amplifiers is connected to the output terminal through a power combiner. The input terminal, the output terminal, and the inputs and the outputs of the semiconductor amplifiers have the characteristic impedance $Z_0$. At least one of the power divider and the power combiner has a plurality of circulators each of which has three terminals. One terminal of each circulator has the characteristic impedance $nZ_0$, and another two terminals have $Z_0$. Thus, by connecting directly the terminals of $nZ_0$ of each circulator, the resultant impedance $Z_0$ is obtained and the circulators are connected to the input terminal and/or the output terminal without utilizing a hybrid circuit.

BRIEF DESCRIPTION OF THE DRAWINGS

The foregoing and other objects, features, and attendant advantage of the present invention will be appreciated as the same become better understood by means of the following description and accompanying drawings wherein.

PREFERRED EMBODIMENTS OF THE PRESENT INVENTION

Figure 1:
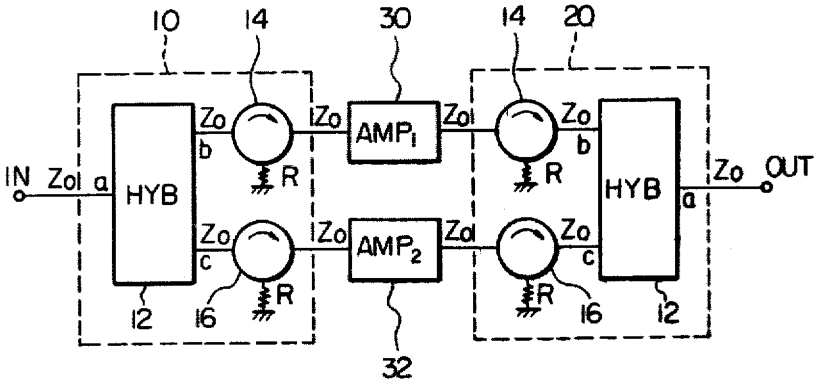
FIG. 1 is a block-diagram of a prior semiconductor amplifier.
Figure 2:
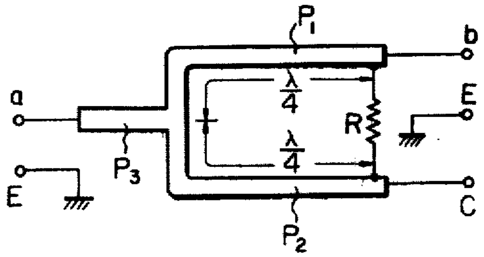
FIG. 2 shows a structure of the prior Wilkinson type hybrid circuit which is utilized in the device in FIG. 1.
Figure 3:
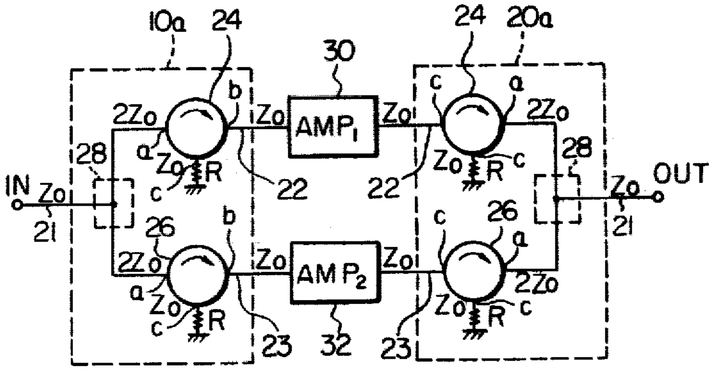
FIG. 3 is a block-diagram of the semiconductor amplifier according to the present invention.

FIG. 3 shows the block-diagram of the present semiconductor amplifier, in which an input terminal(IN) is connected to the power divider **10*a*. The otput terminals 22 and 23 of the power divider 10*a* are connected to the semiconductor amplifiers 30 and 32 respectively, and the outputs of those semiconductor amplifiers are connected in turn to the power combiner 20*a*. And the output terminal of the power combiner 20*a* is connected to the output terminal(OUT). Since the power divider 10*a* and the power combiner 20*a* are a passive circuit and are non-reciprocal circuit, the structure of the power divider can be the same as that of the power combiner, just by reversing the direction of the rotation of the circulators. In FIG. 3, the characteristic impedance of three terminals of the power divider 10*a* and/or the power combiner 20*a* is $Z_0$, which is for instance 50 ohms. Of course the input characteristic impedance and the output characteristic impedance of the amplifiers 30 and 32** are the same as $Z_0$, so that the matching condition of the characteristic impedance is obtained.

Further, the outside circuit connected to the input terminal(IN) and that connected to the output terminal(OUT) have the same characteristic impedance $Z_0$.

In FIG. 3, the input signal applied to the input terminal(IN) is divided by the power divider **10*a* and applied to the pair of semiconductor amplifiers 30 and 32, the outputs of which are combined together through the power combiner 20*a*. Thus, the output power of each semiconductor amplifiers 30 and 32** is doubled.

When there is something wrong with the outside circuits or the amplifier itself, a power reflection will occur due to the mismatching of the characteristic impedance. However, the reflected power is absorbed in the circulator 24 and/or 26, and no problem remains.

Each of the power divider **10*a* and the power combiner 20*a* comprises the first circulator 24, the second circulator 26, and the circuit coupler 28. And each of the circulator 24 and 26 has three terminals a, b, and c. The terminal (a) has the characteristic impedance $2Z_0$ and is connected to the circuit coupler 28. On the other hand, the terminal (b) of the circulator has the characteristic impedance $Z_0$ and is connected to the amplifier 30 or 32**, and the terminal (c) of the circulator has the characteristic impedance $Z_0$ and is connected the ground through the load resistor R, the value of which is the same as $Z_0$ in view of the impedance matching.

It should be appreciated that the characteristic impedance of all the terminals of the present circulator is not the same as with one another, and that is the important feature of the present invention.

Figure 4A:
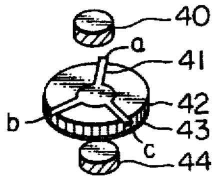
FIG. 4(A) and FIG. 4(B) show the structure of the circulator utilized in the device in FIG. 3.
Figure 4B:
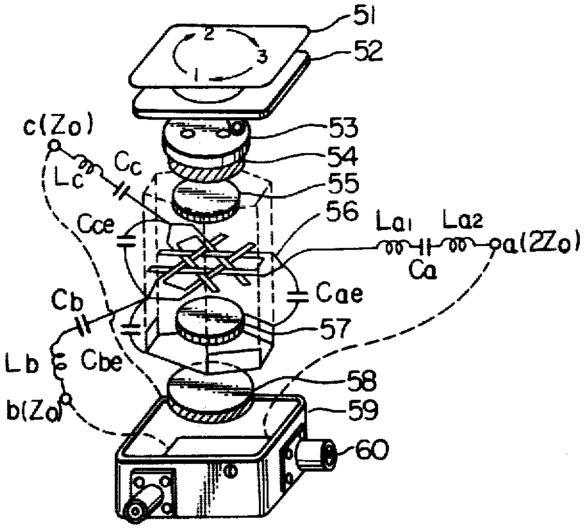

FIG. 4(A) shows the basic structure of a circulator, in which the reference numeral 40 is a ferrite magnet, 41 is a center conductor, 42 is a microwave ferrite, 43 is a ground conductor and 44 is a ferrite magnet. The center conductor 41 has three arms a, b and c each of which operates as the terminal of the circulator. FIG. 4(B) shows another structure of a circulator, in which the reference numeral 51 is a marking plate which indicates the direction of rotation of a signal, 52 is a housing cover, 53 is an adjusting screw, 54 is a ferrite magnet, 55 is a microwave ferrite, 56 is a center conductor which is fork shaped instead of just an arm shaped in FIG. 4(A), 57 is a microwave ferrite, 58 is a ferrite magnet, 59 is a housing, and 60 is a connector.

It should be noted that the structure shown in FIG. 4(A) or FIG. 4(B) is the same as a prior circulator, except that the characteristic impedance of three terminals in FIGS. 4(A) and 4(B) is not the same with one another.

The characteristic impedance of the present circulator can be adjusted either by controlling the width of the arm of the center conductor (FIG. 4(A)), or by connecting a capacitance and an inductance between the center conductor and the terminal of the circulator or the ground. When the characteristic impedance is adjusted by the width of the arm of the center conductor, said width is controlled at the manufacturing stage through measuring the characteristic impedance.

The example of the inductance and the capacitance when the characteristic impedance $Z_0$ is 50 ohms in FIG. 4(B) is as follows.

The characteristic impedance of terminal (a); 100 ohms

The characteristic impedance of terminal (b) and (c); 50 ohms $C_{be}=C_{ce}=5.5$pF $C_b=C_c=3.5$pF $L_b=L_c=0.3\ \mu$H $C_{ae}=5$pF $C_a=2$pF $L_{a1}=0.4\ \mu$H, and $L_{a2}=0.3\ \mu$H It should be noted that $C_a$, $C_b$, $C_c$, $L_a$, $L_b$, $L_c$ are connected between the center conductor and a terminal of the circulator, and $C_{ae}$, $C_{be}$ and $C_{ce}$ are connected between the center conductor and the ground.

Figure 5:
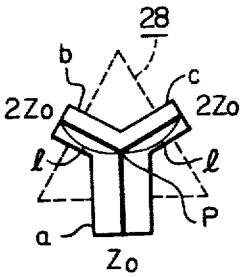
FIG. 5 is the structure of the coupling circuit utilized in the device of FIG. 3.

FIG. 5 shows the circuit coupler 28 in case of a coaxial cable being utilized. The circuit coupler 28 has three arms a, b and c, each of which is composed of a coaxial cable. The inner conductors of those coaxial cables are connected togeter at the point P. Also, the outer conductors of those coaxial cable are electrically connected as shown in FIG. 5. Of course the coaxial cable of the arm (a) has the characteristic impedance $Z_0$, and the coaxial cable of the arms (b) and (c) has the characteristic impedance $2Z_0$. In FIG. 5, the length 1 of the arms b and c of the characteristic impedance $2Z_0$ must be the same with each other in order to assure the in-phase operation of the cell amplifiers.

Figure 6:
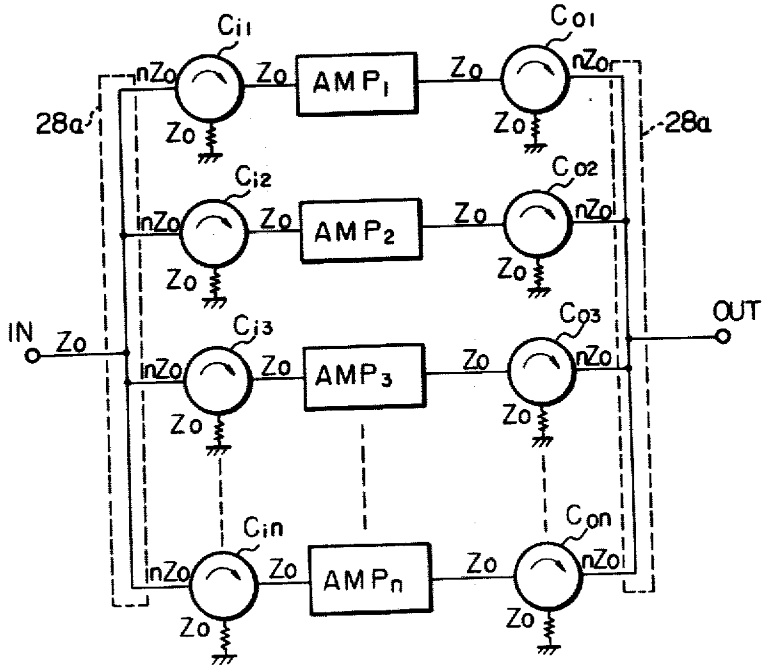
FIG. 6 is the block-diagram of another embodiment of the present invention.

FIG. 6 shows another embodiment of the present semiconductor amplifier, in which n number of cell amplifiers (n is an integer larger than 2) are inserted between a power divider and a power combiner. In this case, the power divider and/or power combiner comprises the n number of circulators and a circuit coupler **28*a*. Each of the circulators ($C_{i1}$ through $C_{in}$ and $C_{oi}$ through Con) has three terminals, and the first terminal has the characteristic impedance $nZ_0$ and the second and the third terminals have the characteristic impedance $Z_0$. The embodiment of FIG. 6 can provide more output power than that of FIG. 3** since many semiconductor amplifiers are provided.

Some modifications of the present invention are of course possible to those skilled in the art. For instance, when the characteristic impedance Z of an input line and/or an output line is different from the characteristic impedance $Z_0$ of the amplifier 30 or 32, the present power divider and/or power combiner can connect those lines and an amplifier. In that case, all that is necessary is that the circulator must have the characteristic impedance 2Z and $Z_0$, instead of $2Z_0$ and $Z_0$. Further, the circuit coupler 28 can be omitted, by just connecting the terminals of two circulators directly. Further, another non-reciprocal element like an isolator can replace a circulator.

From the foregoing it will now be apparent that a new and improved semiconductor amplifier has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. A semiconductor amplifier comprising an input terminal connected to an input line having a characteristic impedance $Z_0$, an output terminal connected to an output line having a characteristic impedance $Z_0$, n number of semiconductor amplifier units the input of each being connected to said input terminal through a power divider and the output of each semiconductor amplifier unit being connected to the output terminal through a power combiner, wherein that said power divider comprises n number of circulators each having three terminals with characteristic impedances $nZ_0$, $Z_0$ and $Z_0$ respectively, the first terminal with the characteristic impedance $nZ_0$ of each circulator being connected directly to said input terminal, the second terminal with the characteristic impedance $Z_0$ of each circulator being connected to ground through a load resistor having a resistance $Z_0$, and the third terminal with the characteristic impedance $Z_0$ of each circulator being connected to the input terminal of the corresponding semiconductor amplifier unit, and wherein said power combiner comprises n number of circulators each having three terminals with characteristic impedances $Z_0$, $Z_0$ and $nZ_0$ respectively, the first terminal with the characteristic impedance $Z_0$ of each circulator being connected to the output terminal of the corresponding semiconductor amplifier unit, the second terminal with the characteristic impedance of $Z_0$ of each circulator being connected to ground through a load resistor having a resistance $Z_0$, and the third terminal with the characteristic impedance $nZ_0$ of each circulator being connected directly to the output terminal.

2. The invention as defined in claim 1, wherein the value of n is 2, and the characteristic impedance $Z_0$ is 50 ohms.

* * * * *